United States Patent
Chen et al.

[19]

[11] Patent Number: 5,982,625
[45] Date of Patent: Nov. 9, 1999

[54] SEMICONDUCTOR PACKAGING DEVICE

[75] Inventors: Kun-Ching Chen, Tainan; Tao-Yu Chen, Kaohsiung; Yung-I Yeh, Kaohsiung; Wu-Chang Wang, Kaohsiung; Chun-Che Lee, Kaohsiung; Chun-Hsiung Huang; Shyh-Ing Wu, both of Kaohsiung Hsien, all of Taiwan

[73] Assignee: Advanced Semiconductor Engineering, Inc., Taiwan

[21] Appl. No.: 09/044,076

[22] Filed: Mar. 19, 1998

[51] Int. Cl.$^6$ .............................. H05K 7/02; H01L 23/28
[52] U.S. Cl. ........................ 361/748; 257/667; 257/787; 361/813
[58] Field of Search .............................. 29/827, 831, 841, 29/855; 174/52.1, 52.2, 52.3, 52.4, 52.5, 250, 256, 257, 258; 257/667, 678, 682, 687, 730, 787, 790, 788; 264/272.14, 272.11, 272.12; 361/748, 750, 760, 782, 783, 777, 779, 813, 820; 438/64, 51, 55, 112, 124, 126, 127

[56] References Cited

U.S. PATENT DOCUMENTS 5,635,671  6/1997  Freyman et al. ...................... 174/52.2
5,708,300  1/1998  Woosley et al. ........................ 257/730
5,780,933  7/1998  Ohmori et al. .......................... 257/787
5,859,475  1/1999  Freyman et al. ......................... 257/788
5,886,398  3/1999  Low et al. ............................... 257/667

FOREIGN PATENT DOCUMENTS

| | | | |
|---|---|---|---|
| 58-159 | 1/1983 | Japan | 257/787 |
| 2-191365 | 7/1990 | Japan | 257/787 |
| 2-280361 | 11/1990 | Japan | 257/787 |
| 3-1560 | 1/1991 | Japan . | |

*Primary Examiner*—Donald Sparks
*Attorney, Agent, or Firm*—Watson Cole Grindle Watson, P.L.L.C.

[57] ABSTRACT

A semiconductor packaging device includes a printed circuit board substrate, a mold gate formed on a periphery of the printed circuit board substrate through which a package encapsulant is poured to enclose electric elements mounted on a side of the printed circuit board, and a layer of non-metallic material covered on the side of the printed circuit board substrate in the mold gate area. The package encapsulant, after hardened, is bonded with the layer of non-metallic material, and the bonded package encapsulant/the layer of non-metallic material is degatable from the mold gate.

20 Claims, 1 Drawing Sheet

SEMICONDUCTOR PACKAGING DEVICE

BACKGROUND OF THE INVENTION

1. Field of the Invention

The present invention relates to a semiconductor packaging device.

2. Description of the Related Art

Conventional quad flat pack (QFP) method and pin-grid array (PGA) method for packaging integrated circuits cannot meet practical need as the functions of the integrated circuits have become more and more complicated while the integration level of the circuits become higher and higher. Ball-grid array integrated circuit (BGA IC) packaging method is one of the newly developed methods for ICs with a quantity of pins and is suitable for packaging integrated circuits of ultra-large scale integration (ULSI) produced by submicron resolution.

Typically, a mold is put on top of a BGA IC, and molten liquid plastic material (i.e., a package encapsulant) is then poured into the mold to completely enclose the integrated circuit chips on the substrate to thereby provide a completely air tight seal for the integrated circuit chips. The BGA IC is removed from the mold after the plastic material is hardened. A subsequent trim work is carried out on an area adjacent to a mold gate of the mold to remove the residual plastic material in a pouring channel of the mold.

In the above-mentioned packaging method for BGA ICs, a metallic plate is provided on the substrate and includes a metallic surface formed by deposition. When the substrate is covered by the mold, the metallic surface is located below the pouring channel of the mold. The metallic surface may serve as an isolation layer between the substrate and the pouring channel to provide an increased degating ability. More specifically, when removing the substrate from the mold, the metallic surface allows the package encapsulant residued in the pouring channel to be easily degated from the substrate. Thus, the residual on the packaged IC can be easily trimmed. Nevertheless, in addition to an increased cost, the metallic plate having the metallic surface occupies a certain space and thus might result in an increase in the product defective index.

The present invention is intended to provide a packaging device which mitigates and/or obviates the above problems.

SUMMARY OF THE INVENTION

It is an object of the present invention to provide a semiconductor packaging device which allows easy degating of the package encapsulant from the mold gate.

A semiconductor packaging device in accordance with the present invention comprises a printed circuit board substrate, a mold gate formed on a periphery of the printed circuit board substrate through which a package encapsulant is poured to enclose electric elements mounted on a side of the printed circuit board, and a layer of non-metallic material covered on the side of the printed circuit board substrate in the mold gate area.

The package encapsulant, after hardened, is bonded with the layer of non-metallic material, and the bonded package encapsulant/the layer of non-metallic material is degatable from the mold gate.

Optionally, a copper pad may be formed between the layer of non-metallic material and the substrate.

The layer of non-metallic material may be a poly ink or a tape of thermoplastic material or thermosetting material.

Other objects, advantages, and novel features of the invention will become more apparent from the following detailed description when taken in conjunction with the accompanying drawings.

DESCRIPTION OF THE PREFERRED EMBODIMENT

Figure 1:
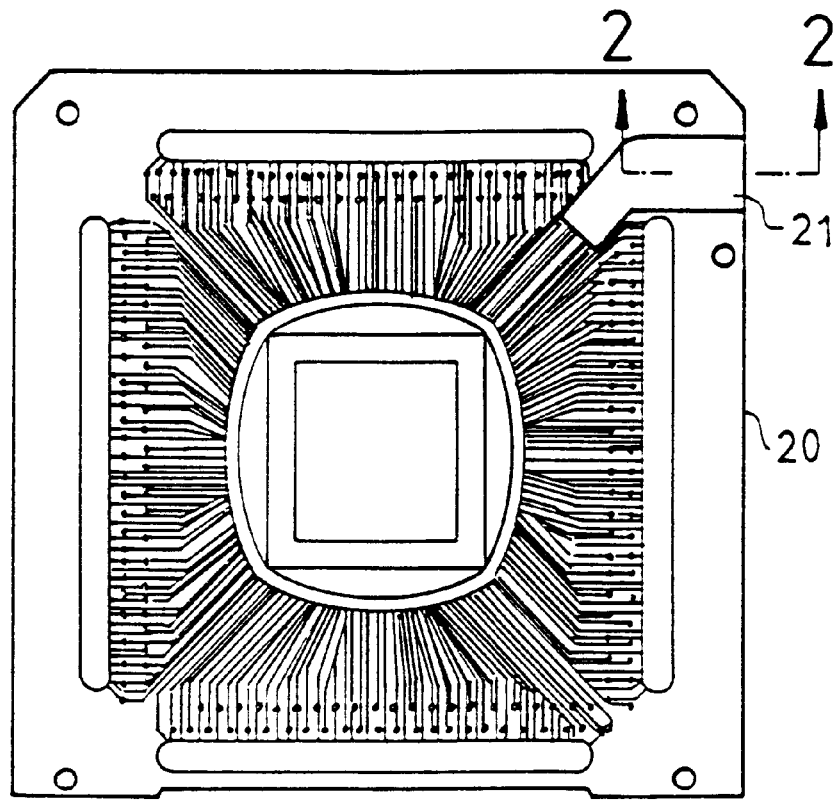
FIG. 1 is a top view of a printed circuit board of a semiconductor packaging device in accordance with the present invention.
Figure 2:
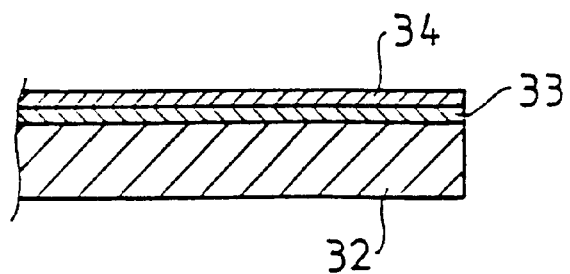
FIG. 2 is a sectional view taken along line 2—2 in FIG. 1.

Referring to the drawings, a semiconductor packaging device in accordance with the present invention includes a printed circuit board 20 with a mold gate 21 on a periphery thereof. The printed circuit board 20 includes a substrate 32 having a copper pad 33 deposited on a surface thereof. When packaging is required, a mold (not shown) is provided on top of the printed circuit board 20, and package encapsulant (not shown) is poured into the mold via the mold gate 21 to enclose electric elements (e.g., chips, not labeled) on the printed circuit board 20. In order to provide a better degating effect between the mold gate 21 and the package encapsulant, in the mold gate 21 area, a layer of non-metallic material 34 is covered on the copper pad 33, best shown in FIG. 2. The layer of non-metallic material 34 may be a tape, poly ink or other non-metallic material which can be applied to the copper pad 33. In the case that the non-metallic material layer 34 is a tape, the tape may be thermoplastic or thermosetting. In addition, the copper pad 34 can be omitted such that the non-metallic material layer 34 is directly applied to the substrate 32. The non-metallic material layer 34 has a better bonding effect with the package encapsulant than with the copper pad 33 or the substrate 32 such that the bonded package encapsulant/non-metallic material layer 34 can be easily degated from the substrate 32 in the mold gate 21 area.

According to the above description, it is appreciated that the metallic plate in the conventional design can be omitted in the present invention to save cost. In addition, the residual package encapsulant are bonded to the non-metallic material layer of the present invention and thus can be easily degated from the substrate.

Although the invention has been explained in relation to its preferred embodiment, it is to be understood that many other possible modifications and variations can be made without departing from the spirit and scope of the invention as hereinafter claimed.

What is claimed is:

1. A semiconductor packaging device, comprising:
   a printed circuit board substrate having a side with electric elements mounted thereon and a periphery,
   a mold gate formed on the periphery of the printed circuit board substrate through which a package encapsulant is poured to enclose the electric elements of the printed circuit board, and
   a layer of non-metallic material covered on the side of the printed circuit board substrate in the mold gate area,
   whereby the package encapsulant, after hardened, is bonded with the layer of non-metallic material, and the bonded package encapsulant/the layer of non-metallic material is degatable from the mold gate.

2. The semiconductor packaging device according to claim 1, further comprising a copper pad formed between the layer of non-metallic material and the substrate.

3. The semiconductor packaging device according to claim 2, wherein the layer of non-metallic material is a tape.

4. The semiconductor packaging device according to claim 3, wherein the tape is made of thermoplastic material.

5. The semiconductor packaging device according to claim 3, wherein the tape is made of thermosetting material.

6. The semiconductor packaging device according to claim 1, wherein the layer of non-metallic material is a tape.

7. The semiconductor packaging device according to claim 6, wherein the tape is made of thermoplastic material.

8. The semiconductor packaging device according to claim 6, wherein the tape is made of thermosetting material.

9. The semiconductor packaging device according to claim 2, wherein the layer of non-metallic material is a poly ink.

10. The semiconductor packaging device according to claim 1, wherein the layer of non-metallic material is a poly ink.

11. A substrate of a semiconductor packaging device, the substrate comprising a side with electric elements mounted thereon and a periphery, a mold gate being formed on the periphery of the substrate through which a package encapsulant is poured to enclose the electric elements on the substrate, and a layer of non-metallic material being covered on the side of the substrate in the mold gate area, whereby the package encapsulant, after hardened, is bonded with the layer of non-metallic material, and the bonded package encapsulant/the layer of non-metallic material is degatable from the mold gate.

12. The substrate according to claim 11, further comprising a copper pad formed between the layer of non-metallic material and the substrate.

13. The substrate according to claim 12, wherein the layer of non-metallic material is a tape.

14. The substrate according to claim 13, wherein the tape is made of thermoplastic material.

15. The substrate according to claim 13, wherein the tape is made of thermosetting material.

16. The substrate according to claim 11, wherein the layer of non-metallic material is a tape.

17. The substrate according to claim 16, wherein the tape is made of thermoplastic material.

18. The substrate according to claim 16, wherein the tape is made of thermosetting material.

19. The substrate according to claim 12, wherein the layer of non-metallic material is a poly ink.

20. The substrate according to claim 11, wherein the layer of non-metallic material is a poly ink.

* * * * *